United States Patent
Kim

(10) Patent No.: US 9,639,127 B2
(45) Date of Patent: May 2, 2017

(54) HEAT DISSIPATING APPARATUS AND ELECTRONIC DEVICE HAVING THE SAME

(71) Applicant: Samsung Electronics Co., Ltd., Suwon-si, Gyeonggi-do (KR)

(72) Inventor: Hae-Soo Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 14/667,035

(22) Filed: Mar. 24, 2015

(65) Prior Publication Data

US 2015/0323262 A1 Nov. 12, 2015

(30) Foreign Application Priority Data

May 7, 2014 (KR) ........................ 10-2014-0054368

(51) Int. Cl.
| | |
|---|---|
| G06F 1/20 | (2006.01) |
| H05K 7/20 | (2006.01) |
| F28F 21/08 | (2006.01) |
| F28D 15/04 | (2006.01) |
| F28D 15/02 | (2006.01) |
| F28F 21/02 | (2006.01) |

(52) U.S. Cl.
CPC ......... *G06F 1/203* (2013.01); *F28D 15/0233* (2013.01); *F28D 15/046* (2013.01); *F28F 21/02* (2013.01); *F28F 21/081* (2013.01); *F28F 21/089* (2013.01); *H05K 7/20336* (2013.01); *F28F 21/083* (2013.01); *F28F 21/084* (2013.01); *F28F 21/085* (2013.01); *F28F 2265/10* (2013.01)

(58) Field of Classification Search
CPC ......... G06F 1/20; G06F 1/203; H01L 23/473; H01L 23/427; H05K 7/2029; H05K 7/20336; F28D 15/02; F28D 15/0233
USPC .......... 361/700, 702, 679.52; 165/80.4–80.5, 165/104.33, 104.19
See application file for complete search history.

(56) References Cited

U.S. PATENT DOCUMENTS

| | | | |
|---|---|---|---|
| 4,046,190 A | 9/1977 | Marcus et al. | |
| 4,386,505 A | 6/1983 | Little | |

(Continued)

FOREIGN PATENT DOCUMENTS

| | | |
|---|---|---|
| JP | 2004-207661 A | 7/2004 |
| JP | 2010-267945 A2 | 11/2010 |

(Continued)

*Primary Examiner* — Zachary M Pape
(74) *Attorney, Agent, or Firm* — Jefferson IP Law, LLP

(57) ABSTRACT

A heat dissipating apparatus and an electronic device having the same are provided. The electronic device includes a body, an internal circuit board provided in the body and including at least one heat generating element, and a heat diffusion type heat dissipating module provided in the body and stacked on a surface of the internal circuit board, so as to diffuse heat generated by the heat generating element toward a low temperature region having a temperature lower than a temperature of the at least one heat generating unit. The heat diffusion type heat dissipating module has a sheet shape which extends from the heat generating element toward a circumference surface of an inside of the body so that the heat is transferred from the heat generating element to the low temperature region.

41 Claims, 12 Drawing Sheets

(56) References Cited

U.S. PATENT DOCUMENTS

| | | | |
|---|---|---|---|
| 6,535,386 B2* | 3/2003 | Sathe | H01L 23/4006 165/104.33 |
| 6,948,556 B1* | 9/2005 | Anderson | F28D 15/0266 165/104.26 |
| 7,738,248 B2* | 6/2010 | Tomioka | G06F 1/203 165/104.21 |
| 8,218,312 B2* | 7/2012 | Watanabe | G06F 1/203 165/104.21 |
| 2003/0047103 A1* | 3/2003 | Rabin | F42B 15/34 102/293 |
| 2006/0005950 A1 | 1/2006 | Wang et al. | |
| 2008/0087405 A1* | 4/2008 | Meng | F28D 15/0283 165/104.26 |
| 2008/0128898 A1 | 6/2008 | Henderson et al. | |
| 2008/0210407 A1* | 9/2008 | Kim | F28D 15/0233 165/104.26 |
| 2008/0236795 A1 | 10/2008 | You et al. | |
| 2009/0178780 A1 | 7/2009 | Kammerzell | |
| 2009/0314480 A1 | 12/2009 | Grinbergs et al. | |
| 2010/0139895 A1* | 6/2010 | Hwang | H01L 23/427 165/104.26 |
| 2011/0110041 A1 | 5/2011 | Wong | |
| 2012/0033385 A1 | 2/2012 | Nagasawa | |
| 2012/0085527 A1 | 4/2012 | Pfaffinger | |
| 2013/0092353 A1* | 4/2013 | Yang | F28D 15/04 165/104.26 |
| 2015/0027668 A1* | 1/2015 | Yang | H05K 7/20336 165/104.26 |

FOREIGN PATENT DOCUMENTS

| | | |
|---|---|---|
| KR | 10-1999-0018178 A | 3/1999 |
| KR | 10-2003-0088999 A | 11/2003 |
| WO | 2014/015188 A | 1/2014 |

* cited by examiner

HEAT DISSIPATING APPARATUS AND ELECTRONIC DEVICE HAVING THE SAME

CROSS-REFERENCE TO RELATED APPLICATION(S)

This application claims the benefit under 35 U.S.C. §119(a) of a Korean patent application filed on May 7, 2014 in the Korean Intellectual Property Office and assigned Serial number 10-2014-0054368, the entire disclosure of which is hereby incorporated by reference.

TECHNICAL FIELD

The present disclosure relate to an electronic device. More particularly, the present disclosure relates to an electronic device having a heat dissipating apparatus.

BACKGROUND

Recently, electronic devices, such as portable phones, MP3 players, Portable Multimedia Players (PMP), electronic book readers, portable tablets, laptop computers, and the like, which a user may carry and use to access various content, are becoming popular. These electronic devices may be provided with various internal modules including a module for transmitting and receiving data, a battery, a driving chip, and the like, as well as a circuit board on which internal parts are mounted. Some parts among the internal modules may emit heat with a high temperature. The high temperature heat generated by these parts has an effect on other parts or modules and may causes the other parts or modules to have a degraded performance due to the negative effect of the heat. As a result, heat dissipating apparatuses, which have different shapes and various structures, are provided to electronic devices in order to cool parts dissipating high temperature heat. However, in a case of a heat generating element, direct cooling is not easy. Typically, in a case of a device, such as a portable phone, an MP3 player, a Portable Multimedia Player (PMP), and the like, which does not require high performance, heat dissipation can be achieved through a heat dissipating structure made of copper or aluminum of which a thermal transfer rate is excellent. On the other hand, in a case of an electronic device, such as a personal computer, a laptop computer, and the like, which requires high performance, heat dissipation is addressed by applying a forced circulation system in which heat transfer is performed by a heat pipe, or high temperature air is discharged outside by a fan.

FIG. 1 is a view illustrating a heat dissipating apparatus of an electronic device using a fan according to the related art. FIG. 2 is a view illustrating a thermal diffusion distribution according to a heat generation of a heat generating element in an electronic device provided with a fan type of heat dissipating apparatus according to the related art.

Referring to FIGS. 1 and 2, the electronic device 10 may be provided with a circuit board 12, on which various modules are mounted, therein. Plural modules are electrically connected to one another on the circuit board 12, and a battery 13 is mounted on the electronic device 10 to supply electric power to the electronic device 10 in order to drive the modules. Various modules of the circuit board 12 may include a heat generating element 11, such as a central processing unit, mounted on the circuit board 12. A heat dissipating apparatus 20 is provided on the circuit board 12 in order to dissipate heat of the heat generating element 11. The heat dissipating apparatus 20 is a fan type of a forced circulation system, which may include a fan 22 and a heat pipe 21. The heat pipe 21 has one end located around the heat generating element 11 and the other end extending by a desired length, so as to transfer the heat of the heat generating element 11 to the fan 22. The fan 22 is located at the other end of the heat pipe 21, and may forcibly discharge the heat transferred from one end to the other end of the heat pipe 21 outside of the electronic device 10.

Considering the heat diffusion distribution of the heat dissipating apparatus having the forced circulation structure as described above, as shown in FIG. 2, the heat generating element 11 is a hot-spot region with the highest temperature, and heat is distributed along the heat pipe 21. The heat diffusion concentrically occurs at a side of the electronic device 10 at which the heat pipe 21 is disposed in the electronic device 10.

The above information is presented as background information only to assist with an understanding of the present disclosure. No determination has been made, and no assertion is made, as to whether any of the above might be applicable as prior art with regard to the present disclosure.

SUMMARY

Aspects of the present disclosure are to address at least the above-mentioned problems and/or disadvantages and to provide at least the advantages described below. Accordingly, an aspect of the present disclosure is to provide an apparatus to the electronic device is operated in a forcibly dissipating manner and has a characteristic of efficiency. However, the heat dissipating apparatus requires essential structural elements, such as an in/out-vent and the like, for a removal of noise and a circulation of air according to use of the fan. That is, use of the heat dissipating apparatus cannot be easy in a site requiring a calm environment because of the noise generated due to use of the fan.

Further, a whole thickness of the electronic device must be increased according to the thickness of the fan.

In addition, since external air is forcibly circulated into the electronic device and air introduced into the electronic device is forcibly circulated to the outside of the electronic device, in order to dissipate heat through the fan, foreign substances may be introduced into the electronic device from the outside, and also the introduced foreign substances may be easily accumulated on the fan or the vent. Accordingly, the foreign substances must be periodically removed from the parts, such as a fan or a vent, on which the foreign substances are accumulated.

Further, since the electronic device is provided with the in/out-vent for assisting a smooth flow of air, establishment of an external design of the electronic device may be limited and aesthetic appreciation or variety of the external design may be negatively affected.

On the other hand, in a case of the heat pipe, a refrigerant may flow in the heat pipe. When interference with other parts is caused in a section in which the refrigerant flows, however, it is difficult to cut the heat pipe or design the heat pipe to avoid the interference. If the heat pipe interferes with peripheral parts, the heat pipe in the interference occurring region cannot be cut. Therefore, it is necessary to design the heat pipe detouring to avoid the interference region. Furthermore, the heat pipe cannot be made to have a width more than 20 nm due to a manufacturing limitation. Accordingly, there is a limitation in that the heat pipe is used for a thermal diffusion in a width direction. In a case of using the heat pipe, accordingly, it is identified whether the interference between the heat pipe and other parts may occur in designing the heat pipe to avoid the interference, and there is inconvenience in that the heat pipe is designed to avoid the interference even though the heat pipe partially interferes with other parts.

In a case of the heat pipe, there is a limitation in a heat dissipating direction because the heat is transferred in only one direction from the heat generating element to the fan.

Since the heat is concentrated only in the heat pipe, the heat pipe may be locally overheated. Accordingly, a hot-spot may be formed on the heat pipe. In addition, peripheral parts located at and around the hot-spot may be deformed, or the capability of the peripheral parts may be degraded.

Accordingly, aspects of the present disclosure are to solve the above-mentioned problem in the conventional art, and an aspect of the present disclosure is to provide a heat dissipating apparatus, which has the fan type of forced circulation structure to dissipate the heat generated by the heat generating element and in which heat dissipation can be achieved by using heat diffusion through a wide area, and an electronic device having the same.

Another aspect of the present disclosure is to provide a heat dissipating apparatus which has no structural parts such as a fan and an in/out-vent which are used in the conventional heat dissipating apparatus having the fan type of forced circulation system and has a high efficiency due to a simple structure, and an electronic device having the same.

Another aspect of the present disclosure is to provide a heat dissipating apparatus in which a separate operation force is unnecessary, thereby reducing consumption of electric power, and an electronic device having the same.

Another aspect of the present disclosure is to provide a heat dissipating apparatus which has a simple structure so as to avoid interference with other parts even though the heat dissipating apparatus is mounted, and to partially avoid interference, and an electronic device having the same.

Another aspect of the present disclosure is to provide a heat dissipating apparatus which is capable of diffusing heat of a heat generating device in different directions, and an electronic device having the same.

Another aspect of the present disclosure is to provide a heat dissipating apparatus which has no effect on an appearance of an electronic device, and the electronic device having the same.

Another aspect of the present disclosure is to provide a heat dissipating apparatus which can avoid inconvenience in that alien substances should be periodically removed like in the fan type of heat dissipating apparatus and can be semi-permanently used, and an electronic device having the same.

Another aspect of the present disclosure is to provide a heat dissipating apparatus which has a simple structure, thereby making a minimal effect on a whole thickness of an electronic device, and the electronic device having the same.

In accordance with an aspect of the present disclosure, a heat dissipating apparatus is provided. The heat dissipating apparatus includes a vapor chamber configured to diffuse heat from a heat generating element mounted on an internal circuit board of a body of an electronic device to an inside of the body having a low temperature portion with a temperature lower than a temperature of the heat generating element, and including an interference prevention portion when an interference element is present.

In accordance with another aspect of the present disclosure, an electronic device is provided. The electronic device includes a body, an internal circuit board provided in the body and including at least one heat generating element, and a heat diffusion type heat dissipating module provided in the body and stacked on a surface of the internal circuit board, so as to diffuse heat generated by the heat generating element toward a low temperature region having a lower temperature than a temperature of the at least one heat generating unit, wherein the heat diffusion type heat dissipating module has a sheet shape, and extends from the heat generating element toward a circumference surface of the inside of the body so that the heat is transferred from the heat generating element to the low temperature region.

In accordance with another aspect of the present disclosure, an electronic device having a heat dissipating apparatus is provided. The electronic device includes a body, an internal circuit board provided in the body and including at least one heat generating element, a vapor chamber provided in the body and stacked on a surface of the internal circuit board, so as to diffuse heat generated by the heat generating element from the heat generating element to a circumference of the body which is a low temperature region having a temperature lower than a temperature of the at least one heat generating unit, an interference prevention hole formed in the vapor chamber when an interference element is present on the internal circuit board, and a block module configured to transfer the heat of the heat generating element toward the vapor chamber. The vapor chamber includes a first metal plate having a sheet shape and extending from the heat generating element to a circumference surface of the low temperature portion, a second metal plate stacked on the first metal plate and extending from the heat generating element to the low temperature portion, a refrigerant member interposed between the first metal plate and the second metal plate, and a sealing portion sealing a mounting space of the refrigerant member along circumferences of the first metal plate and the second metal plate and a circumference of the interference prevention hole when the interference prevention portion is present.

In accordance with still another aspect of the present disclosure, a heat dissipating apparatus is provided. The heat dissipating apparatus includes a vapor chamber which diffuses heat from a heat generating element mounted on an internal circuit board of a body of the electronic device to the inside of the body having a relatively low temperature portion, and includes an interference prevention portion according to a presence and an absence of the interference element.

The embodiments of the present disclosure have an advantage in that high temperature heat generated by the heat generating element of the electronic device is diffused from whole areas or a high temperature area of the heat generating element to a low temperature area in which the temperature is relatively low as compared with the high temperature area, thereby decreasing the temperature of the heat generating element.

Further, since the heat dissipating apparatus has a sheet shape, the structure or shape of the heat dissipating apparatus is simple. There is an advantage in that the heat dissipating apparatus can be easily assembled with the electronic device.

The heat dissipating apparatus with the sheet shape may be detachably attached to the electronic device to diffuse the heat. Accordingly, the heat dissipating apparatus has no separate operating unit for operating the heat dissipating apparatus, thereby reducing consumption of the electric power.

While the heat dissipating apparatus having the fan type of forced circulation system needs electric power for operating the fan, the heat dissipating apparatus according to embodiments of the present disclosure does not need electric power for operating the fan. Accordingly, it is possible to reduce the consumption of electric power. Further, in the heat dissipating apparatus according to the related, noise of the fan restricts an environment in which the electronic device is used. However, the heat dissipating apparatus according to various embodiments of the present disclosure can be freely designed without concern of noise because of having no fan. Accordingly, there is an advantage in that an environment in which the heat dissipating apparatus is used is not restricted.

In addition, the heat dissipating apparatus according to embodiments of the present disclosure has a hole for a prevention of interference with a location of other parts. Accordingly, although the heat dissipating apparatus interferes with other parts arranged in the electronic device when the heat dissipating device is mounted on the electronic device, it is possible to avoid the interference with other parts or to partially avoid the interference with other parts because of the simple structure of the heat dissipating apparatus.

Furthermore, since the heat dissipating apparatus according to embodiments of the present disclosure widely covers an inner edge of a periphery of the electronic device, which includes the low temperature area around the heat generating element, the heat of the heat generating element can be diffused in different directions as well as in a single direction, thereby improving heat efficiency.

Moreover, when the heat dissipating apparatus according to embodiments of the present disclosure is mounted around the heat generating element on an inner surface of the electronic device, the heat dissipation can be established by diffusing the heat of the heat generating element in the different directions. Therefore, the heat dissipating apparatus does not need a separate structure related to the heat dissipating apparatus on a surface of the electronic device, for example, a structure such as an air vent, or a shape. Accordingly, there is an advantage in that the appearance of the electronic device can be freely designed.

When the heat generating device according to the related art has an air vent, the electronic device having the heat generating device according to the related art cannot be used on a product, such as a cushion or bedclothes, which has a buffering capability. However, since the heat dissipating apparatus of the present disclosure has no air vent, the user can freely use the electronic device having the heating dissipating apparatus without a restriction of the environment.

Furthermore, in a case of the fan type heat dissipating apparatus, foreign substances accumulated on the fan or the in/out-vent due to the forced circulation of the air must be periodically removed. However, in the heat dissipating apparatus according to the various embodiments of the present disclosure, an introduction of alien substances into the electronic device can be prevented because the heat dissipating apparatus dissipates the heat from the electronic device to the outside in the heat diffusion manner, and it is unnecessary to periodically clean the heat dissipating apparatus. Accordingly, there are advantages in that the convenience of the user can be improved and that the heat dissipating apparatus can be semi-permanently used after it is mounted on the electronic device.

Moreover, since the heat dissipating apparatus according to embodiments of the present disclosure has a sheet shape and a simple junction for coupling the heat dissipating apparatus to the electronic device, the heat dissipating apparatus does not significantly affect a thickness of the electronic device, and the electronic device can wholly have a slim thickness.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

Figure 1:
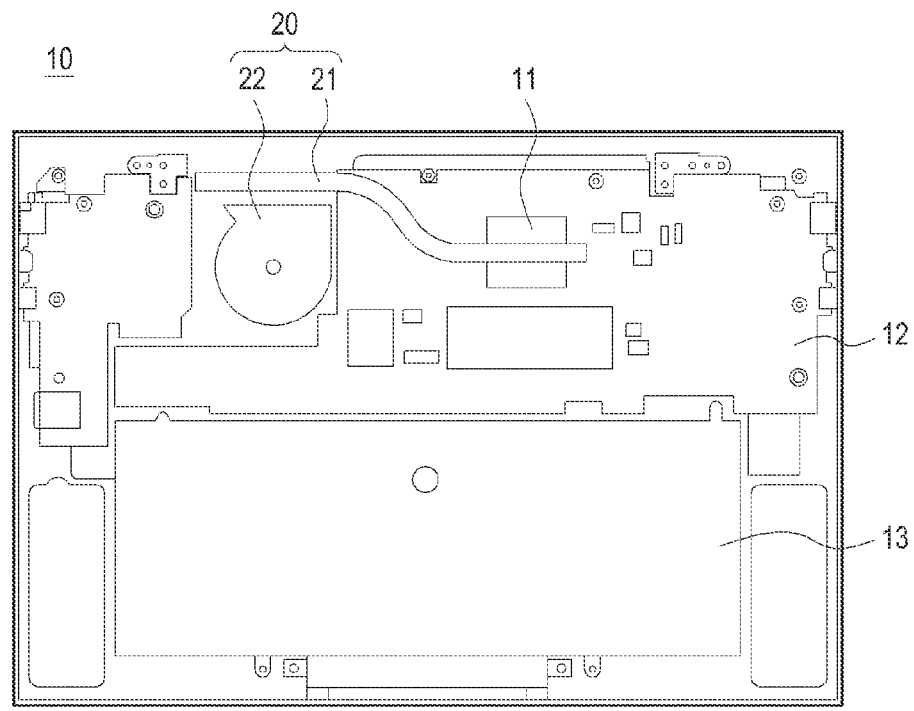
FIG. 1 is a view illustrating a heat dissipating apparatus of an electronic device using a fan according to the related art.
Figure 2:
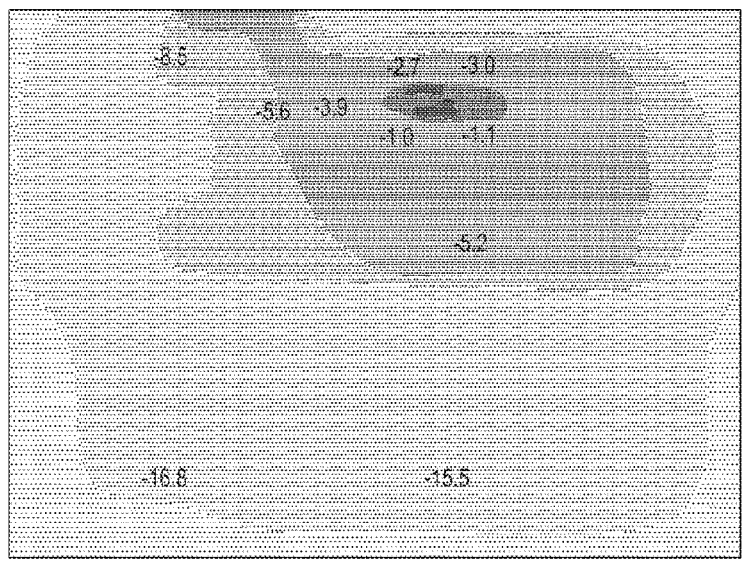
FIG. 2 is a view illustrating a thermal diffusion distribution according to a heat generation of a heat generating element in an electronic device provided with a fan type of a general heat dissipating apparatus according to the related art.

The following description with reference to the accompanying drawings is provided to assist in a comprehensive understanding of various embodiments of the present disclosure as defined by the claims and their equivalents. It includes various specific details to assist in that understanding, but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but are merely used by the inventor to enable a clear and consistent understanding of the present disclosure. Accordingly, it should be apparent to those skilled in the art that the following description of various embodiments of the present disclosure is provided for illustration purposes only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Relative terms, such as a front surface, a rear surface, an upper surface, and a lower surface, which are described with reference to the drawings, may be replaced by ordinal numbers such as first and second. In the ordinal numbers such as first and second, their order are determined in the mentioned order or arbitrarily and may be arbitrarily changed if necessary.

The terms used in this application merely are for the purpose of describing particular embodiments and are not intended to limit the present disclosure. Singular forms are intended to include plural forms unless the context clearly indicates otherwise. In the description, it should be understood that the terms "include" or "have" indicate existence of a feature, a number, a step, an operation, a structural element, parts, or a combination thereof, and do not previously exclude the existences or probability of addition of one or more another features, numeral, steps, operations, structural elements, parts, or combinations thereof.

Unless defined differently, all terms used herein, which include technical terminologies or scientific terminologies, have the same meaning as that understood by a person skilled in the art to which the present disclosure belongs. Such terms as those defined in a generally used dictionary are to be interpreted to have the meanings equal to the contextual meanings in the relevant field of art, and are not to be interpreted to have ideal or excessively formal meanings unless clearly defined in the present specification.

In the present disclosure, an electronic device may refer to a terminal, a portable terminal, a mobile terminal, a communication terminal, a portable communication terminal, a portable mobile terminal, a display device, and the like.

For example, the electronic device may be a smartphone, a portable phone, a game player, a TV, a display unit, a heads-up display unit for a vehicle, a notebook computer, a laptop computer, a tablet Personal Computer (PC), a Personal Media Player (PMP), a Personal Digital Assistants (PDA), and the like. The electronic device may be implemented as a portable communication terminal which has a wireless communication function and a pocket size. The electronic device may also be a flexible device or a flexible display device.

Figure 3:
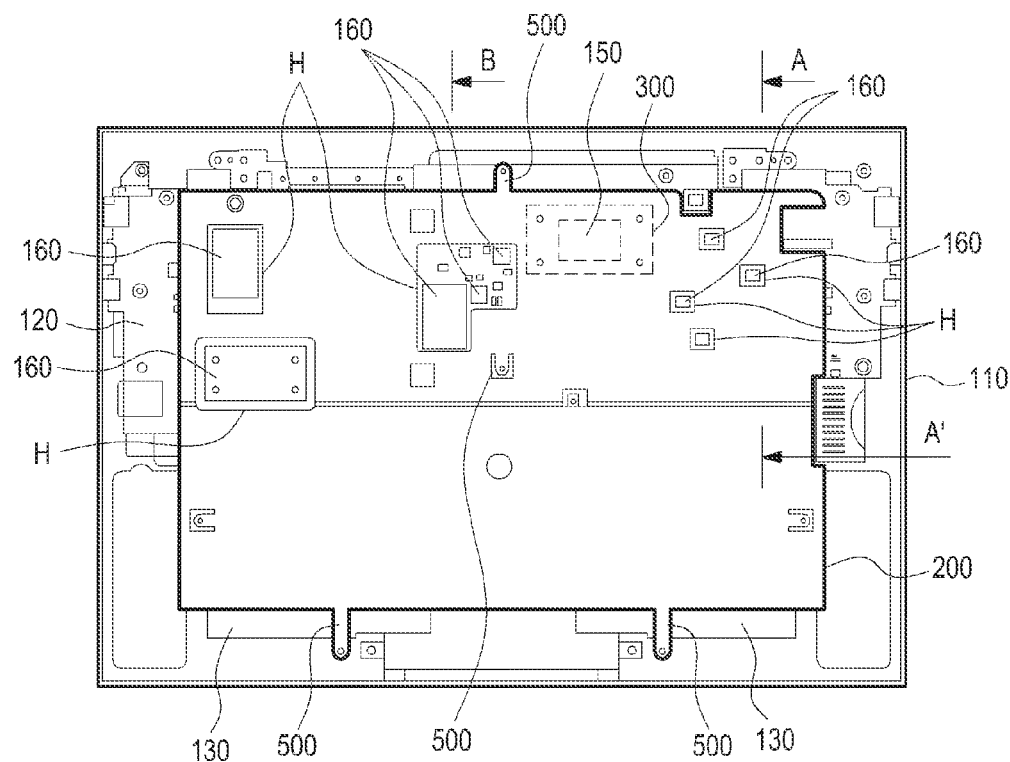
FIG. 3 is a view illustrating an electronic device provided with a heat dissipating apparatus according to an embodiment of the present disclosure.
Figure 4:
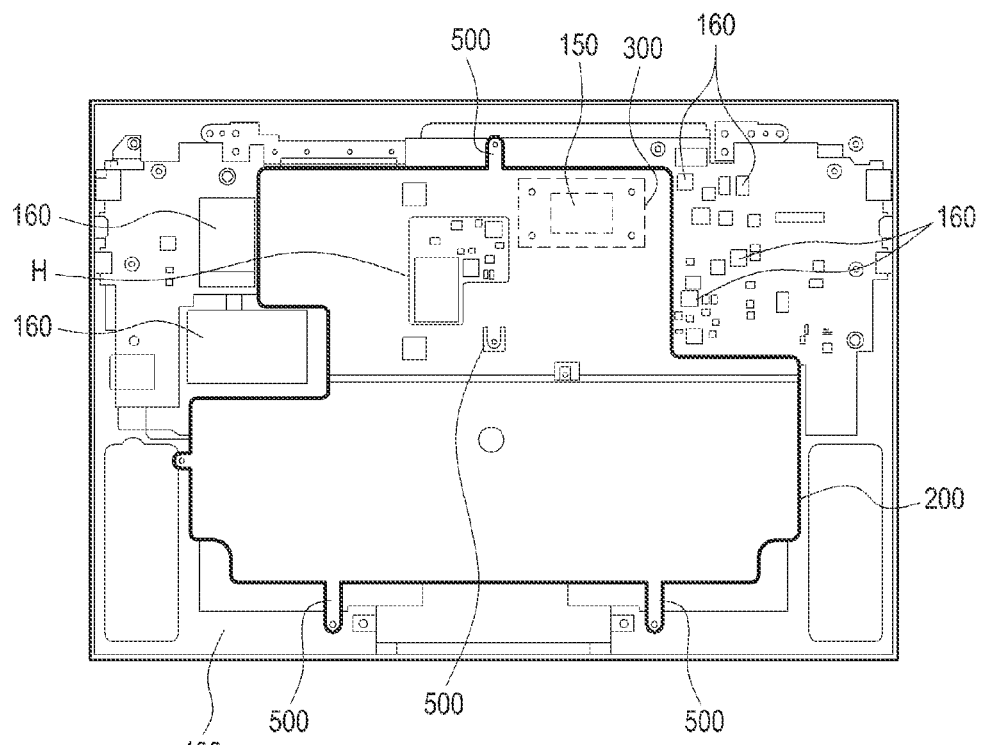
FIG. 4 is a view illustrating an electronic device provided with a heat dissipating apparatus having a different shape due to a location of an interference element according to an embodiment of the present disclosure.

FIG. 3 is a view illustrating an electronic device provided with a heat dissipating apparatus according to an embodiment of the present disclosure. FIG. 4 is a view illustrating an electronic device provided with a heat dissipating apparatus having a shape different from that of the heat dissipating apparatus of FIG. 3 due to an arrangement of an interference element, according to an embodiment of the present disclosure.

Referring to FIGS. 3 and 4, the electronic device 100 may include a heat dissipating apparatus. The electronic device 100 may include a body 110, an internal circuit board 120, and a heat diffusion type heat dissipating module 200, and may further include a block module 300, a heat sink 400, a coupling member 500 and a heat insulation member 600.

The body 110 may include one housing or a combination of two or more housings according to a function, a structure, or a design of the electronic device 100. The body 110 may be provided with a display unit (not shown) through which a user identifies a screen, a touch panel (not shown) capable of implementing an input according to a touch, and input buttons such as an electric power key, a sound control key, and the like. A camera, a microphone, a speaker, and the like may be mounted on the electronic device 100. The body 110 may be provided with a front case (not shown) and a rear case (not shown). The internal circuit board 120 and the heat dissipating module 200 may be arranged between the front case and the rear case. The electronic device 100 may have a battery 130 for supplying electric power to the electronic device 100. The body 110 may have a space (not shown) in which the battery 130 may be disposed.

Figure 6:
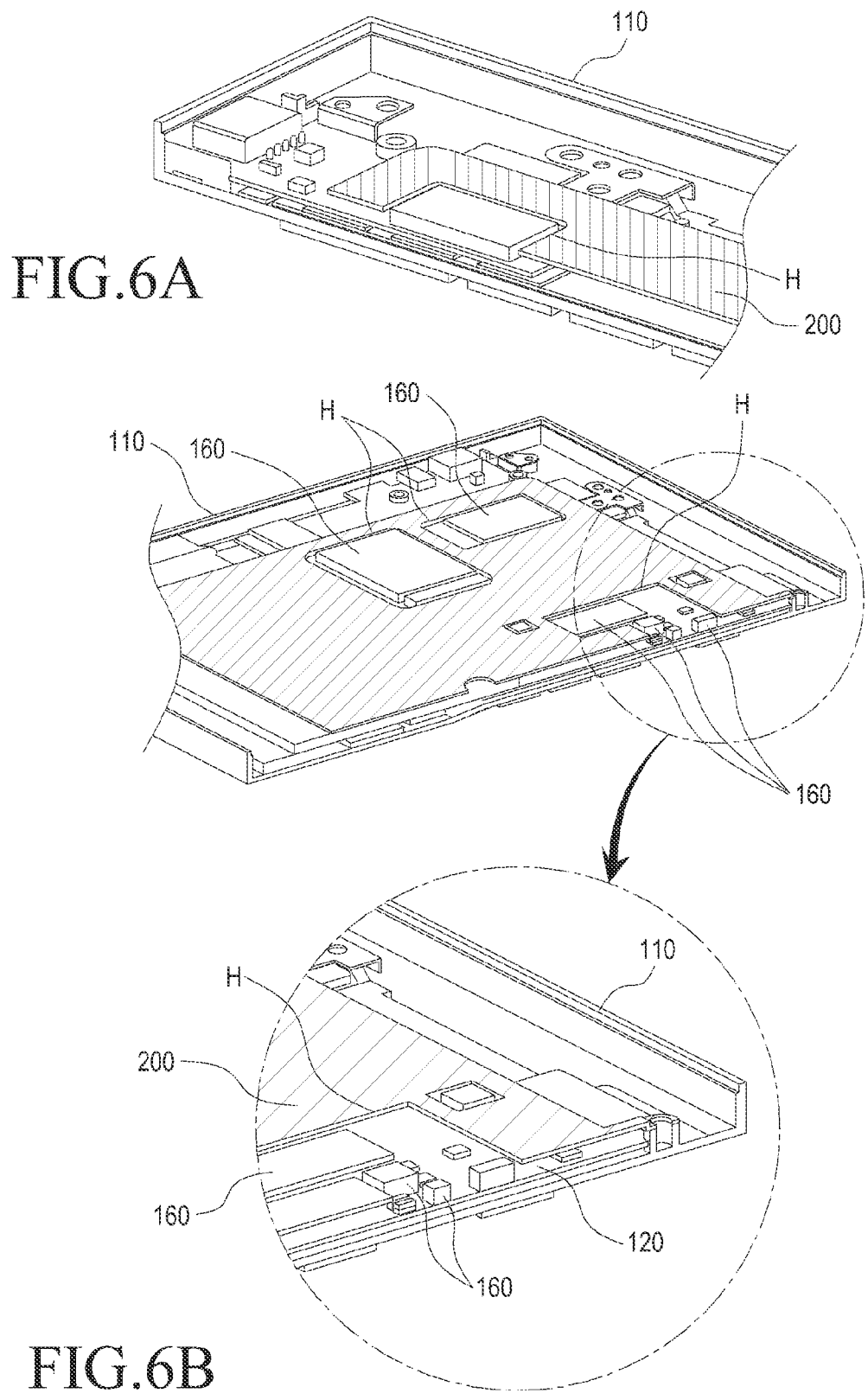
FIGS. 6A and 6B are perspective sectional views illustrating an electronic device provided with a heat dissipating apparatus according to an embodiment of the present disclosure, in which a stacked structure of the heat dissipating apparatus is shown.

The internal circuit board 120 is arranged in the body 110 At least one heat generating element 150, for example, a CPU, a graphics chip, a memory chip, and a power module may be arranged on the internal circuit board 120. The internal circuit board 120 may have an interference element 160, which may cause interference with a heat dissipating member described later, thereon. For example, the interference element 160 may be mounted on the internal circuit board 120 to protrude at a desired height, or to have a greater thickness than other parts. However, the interference element 160 need not be mounted on the internal circuit board 120. For example, when the interference element 160 is mounted on the internal circuit board 120, the interference element 160 may cause interference when the heat diffusion type heat dissipating module 200 described later is mounted on the internal circuit board 120. Accordingly, interference preventing units H may be disposed on the heat diffusion type heat dissipating module 200 so as to prevent interference with the interference element 160, as shown in FIGS. 6A and 6B.

The heat generating element 150 mounted on the internal circuit board 120 discharges high temperature heat as it operates. This heat affects the internal circuit board 120 on which a peripheral part or the heat generating element 150 is mounted, which may deform or damage the peripheral parts or the heat generating element 150. To address this issue, the electronic device 100 according to various embodiments of the present disclosure may be provided with a heat diffusion type heat dissipating module 200 capable of spreading and diffusing heat in order to efficiently dissipate heat generated by the heat generating element 150.

The heat diffusion type heat dissipating module 200 may be mounted on the body so as to be stacked on the internal circuit board 120. Further, the heat diffusion type heat dissipating module 200 may be implemented to have a large area so as to dissipate the heat of the heat generating element 150. The heat pipe according to the related transfers the heat only in one direction from the heat generating element 150 due to a restricted width thereof, while the heat dissipating module 200 extends from the heat generating element 150 to a periphery of an inside of the body 110, which is a relatively low temperature area. The 'large area' refers to a size of the heat dissipating module 200 which is similar to that of the electronic device 100, or greater than or equal to half a size of the electronic device 100, so that the heat dissipating module 200 can sufficiently dissipate the heat generated by the heat generating element 150. The heat diffusion type heat dissipating module 200 according to the embodiment of the present disclosure may have a rectangular shape similar to the body 110, as shown in FIG. 3. Further, the heat diffusion type heat dissipating module 200 has a cut surface (e.g., indentations or cutouts) formed by cutting a part of the heat dissipating module 200 according to a position of the interference element 160, in order to avoid interference with the interference element 160. The interaction between the interference element 160 and the heat dissipating module is described below in more detail with respect to FIGS. 6A and 6B.

A predetermined portion on a surface of the heat diffusion type heat dissipating module 200 is engaged with the heat generating element 150. The heat diffusion type heat dissipating module 200 is provided so that the edges are located at a position near the periphery of the inside of the body 110, in order to widely diffuse the heat generated by the heat generating element 150. Accordingly, the heat diffusion type heat dissipating module 200 is disposed so that the high temperature heat generated by the heat generating element 150 is diffused to an outermost end of the heat diffusion type heat dissipating module 200 after being transferred from a surface in contact with the heat diffusion type heat dissipating module 200. As described above, the heat diffusion type heat dissipating module 200 according to an embodiment of the present disclosure has a sheet shape and extends from the heat generating element 150 to a position near the peripheral surface of the inside of the body 110. The heat dissipating module 200 is stacked on one surface of the internal circuit board 120, so as to diffuse the heat generated by the heat generating element 150 to the peripheral surface of the inside of the body 110.

The heat diffusion type heat dissipating module 200 according to an embodiment of the present disclosure may include a vapor chamber 200. As described below, the vapor chamber 200 is filled with a refrigerant, and the heat of the heat generating element 150 can be transferred from a high temperature portion to a low temperature portion of the heat generating element 150 through a phase change of the refrigerant filled in the vapor chamber 200, for example, a phase change of the refrigerant such as evaporation or liquefaction, caused by the heat of the heat generating element 150.

Figure 5:
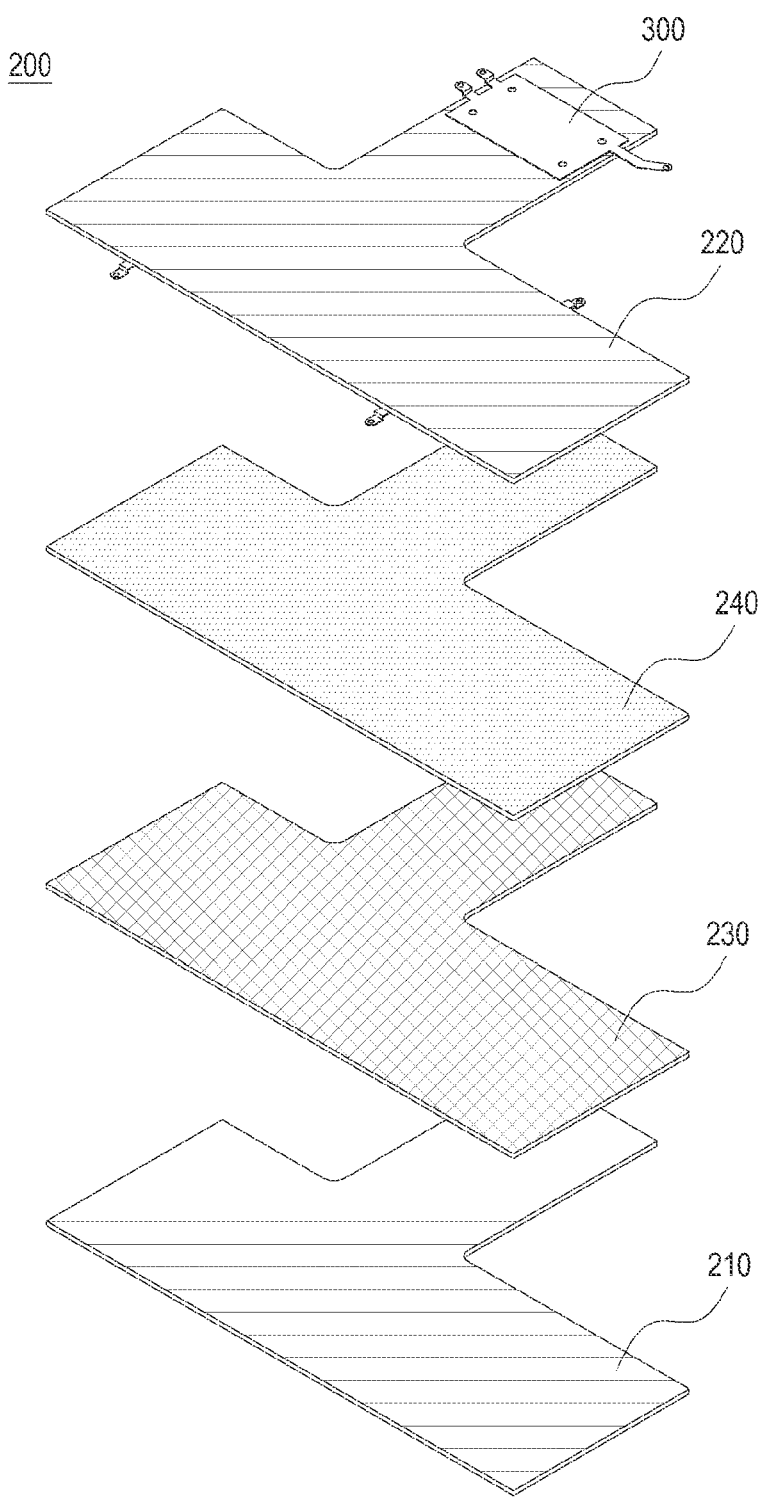
FIG. 5 is an exploded perspective view illustrating a heat dissipating apparatus of an electronic device provided according to an embodiment of the present disclosure, in which elements constructing the heat dissipating apparatus are stacked.

FIG. 5 is a perspective sectional view illustrating an electronic device provided with a heat dissipating apparatus according to an embodiment of the present disclosure, in which a stacked structure of the heat dissipating apparatus is shown.

Referring to FIG. 5, the vapor chamber 200 may include a first metal plate 210, a second metal plate 220, and the above-mentioned refrigerant. The vapor chamber 200 may include embedded members 230 and 240 for absorbing and transferring the refrigerant according to the phase change of the refrigerant provided between the first metal plate 210 and the second metal plate 220.

The first metal plate 210 and the second metal plate 220 have a thin plate of a sheet shape, and extends from the heat generating element 150 to the peripheral surface of the inside of the body 110. The first metal plate 210 and the second metal plate 220 receive the heat of the heat generating element 150, and are made of a metal material so as to dissipate the received heat to the outside of the vapor chamber 200. The first metal plate 210 and the second metal plate 220 may be made of at least one or a combination of a copper sheet, an aluminum sheet, a stainless steel sheet, and a graphite sheet. For example, the first metal plate 210 and the second metal plate 220 may be made of one material selected from the above-mentioned materials. Alternatively, the first metal plate 210 may be made of one of the above-mentioned materials, and the second metal plate 220 may be made of a different material among the above-mentioned material. The first metal plate 210, a nano-fiber 240 (described later), a mesh 230, and the second metal plate 220 are sequentially stacked, and a block module 300 (described later) such as a copper block may be stacked between the heat generating element 150 and the first metal plate 210.

FIGS. 6A and 6B are an exploded perspective views illustrating a heat dissipating apparatus of an electronic device provided according to one of various embodiments of the present disclosure, in which elements constructing the heat dissipating apparatus are stacked.

Referring to FIGS. 6A and 6B, the vapor chamber 200 may further include an interference prevention portion H. The interference prevention portion H may be provided in the vapor chamber 200 in order to avoid interference with the interference element 160 according to the presence and the absence of the interference element 160 mounted on the internal circuit board 120. The 'interference element 160' refers to an element arranged higher than the elements mounted on the internal circuit board 120, or heat-sensitive elements. The interference element 160 may refer to elements which are subjected to pressure when the vapor chamber 200 is stacked on the internal circuit board 120, or which may be affected by the high temperature heat. The interference prevention portion H may be formed as an interference prevention hole H so that the interference element 160 is exposed from the vapor chamber 200.

The interference prevention holes H in two shapes will be described as an example. The interference prevention hole according to the first embodiment may be provided at a predetermined position (a position at which the vapor chamber 200 is engaged with an interference element 160) of the vapor chamber 200 with a rectangular shape, as shown in FIG. 3. When the interference element 160 is disposed along the periphery of the internal circuit board 120, the interference prevention hole H may be formed as an opening at an end of the vapor chamber 200, as shown in FIG. 4. Accordingly, the vapor chamber 200 having the interference prevention portion H according to the second embodiment has a difference in a shape from the vapor chamber 200 having the interference prevention portion H according to the first embodiment. The vapor chamber 200 according to the first embodiment has the rectangular shape. However, the vapor chamber 200 according to the second embodiment may have a different shape from the vapor chamber 200 having the rectangular shape because the vapor chamber 200 is cut at a portion corresponding to a position of the interference element 160.

When the interference element 160 is arranged on the internal circuit board 120, the interference prevention holes H are formed at portions of the first and second metal plates 210 and 220 corresponding to the position of the interference element 160 so that the interference element 160 is segregated from the vapor chamber 200. When the vapor chamber 200 is stacked on the internal circuit board 120, the interference element 160 may be seated in the interference prevention hole H. The interference prevention portion H according to the embodiments of the present disclosure is formed as a hole or opening in the vapor chamber 200 of a sheet shape, thereby implementing a design, which is to avoid the interference with the interference element 160 provided on the internal circuit board 120, in a simple structure.

Figure 7:
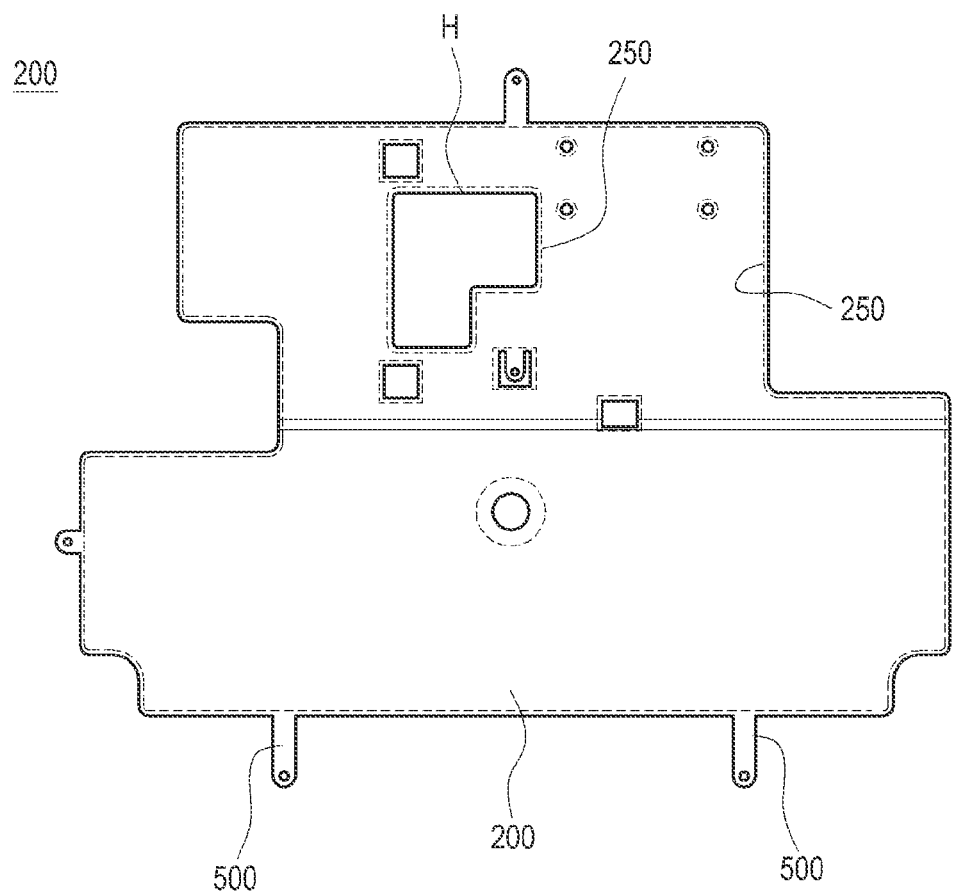
FIG. 7 is a view illustrating a sealing portion of a heat dissipating member in an electronic device provided with a heat dissipating apparatus according to an embodiment of the present disclosure.

FIG. 7 is a view illustrating a sealing portion of a heat dissipating member in an electronic device provided with the heat dissipating apparatus according to an embodiment of the present disclosure.

Referring to FIG. 7, the sealing portion 250 may be provided along edges of the first and second metal plates 210 and 220, which seals a space between the first metal plate 210 and the second metal plate 220 that is filled with the refrigerant. The vapor chamber 200 may extend from the heat generating element 150 to the relatively low temperature region to have a wide area. When the vapor chamber 200 extends to the peripheral surface of the inside of the body 110, the wider the area is, the more a heat dissipating effect increases. The vapor chamber 200 may have a size nearly identical to that of the electronic device 100, or a size greater than or equal to half a size of the electronic device 100. Further, the vapor chamber 200, in which the first metal plate 210, the second metal plate 220, and the internal member 230 and 240 are stacked, may have an opening formed at an end surface thereof to avoid the interference with the interference element 160, or have an interference prevention hole formed therein. In addition, although the vapor chamber 200 is mounted on the internal circuit board 120, the first metal plate 210 and the second metal plate 220 should be maintained to be thin and sealed so that the electronic device 100 has a slim thickness. Accordingly, the sealing portion 250 may be implemented by a seam-welding or a laser-welding. Alternatively, the sealing portion may be implemented in a manner of soldering or brazing in which a filler metal is filled between the first metal plate 210 and the second metal plate 220, and melted at a temperature lower than 450° C. or higher than 450° C. in order to maintain air-tightness of the first and second metal plates 210 and 220. In addition to the welding, the sealing may be implement by a bonding the first metal plate 210 and the second metal plate 220 using a bonding agent.

When the interference prevention hole H is formed in the vapor chamber 200 due to the presence of the interference element 160 as described above, the sealing portion 250 (hereinafter, referred to as 'prevention-hole sealing portion 250') may be established around a circumference of the interference prevention hole H. The prevention-hole sealing portion 250 may be sealed by at least one of the seam welding, the laser welding, the soldering, the brazing, and the bonding as described above. When the interference element 160 is formed on the internal circuit board 120 to have a different height from those of other parts, although only the interference prevention hole H is formed, it is possible to avoid the interference with the interference element 160.

The refrigerant is filled in the space between the first metal plate 210 and the second metal plate 220, and is repeatedly subjected to phase change from liquid to gas (gasification), or from gas to liquid (liquefaction) due to the heat transferred from the heat generating element 150 to the second metal plate 220, so as to transfer the heat from the high temperature region of the heat generating element 150 to the low temperature region of the edge of the vapor chamber 200, thereby efficiently dissipating the heat. A material such as pure water, acetone, or ammonium may be used as the refrigerant; however, the refrigerant is not limited to these examples.

The refrigerant may be filled between the first metal plate 210 and the second metal plate 220, and the internal members 230 and 240 may be interposed between the first metal plate 210 and the second metal plate 220 in order to implement the movement of the refrigerant.

The internal members 230 and 240 may include the mesh portion 230 and the nano-fiber portion 240, as shown in FIG. 5.

The mesh portion 230 is stacked between the first metal plate 210 and the second metal plate 220, which is provided to secure an air retainer and a space between the first metal plate 210 and the second metal plate 220 in order to allow the movement of the phase-changed refrigerant. The mesh portion 230 is made to be a woven structure.

The nano-fiber portion 240 is stacked between the mesh portion 230 and one of the first and second metal plates 210 and 220, for example, between the mesh portion 230 and the second metal plate 220, and may be provided in a state of absorbing the refrigerant. The nano-fiber portion 240 may include a nonwoven fiber and a woven fiber having a fine fiber portion.

Although the internal portions 230 and 240, which include the mesh portion 230 and the nano-fiber portion 240, have been described as an example, the internal portions are not limited thereto. For example, as described below, instead of the mesh portion 230, a prominence and depression member 230a may be formed which is capable of transferring the refrigerant to the first metal plate 210 or the second metal plate 220. Accordingly, if a member or a space can secure a movement path for an evaporated gas, a member for a movement of the refrigerant may be formed to have various structures or shapes.

Figure 8:
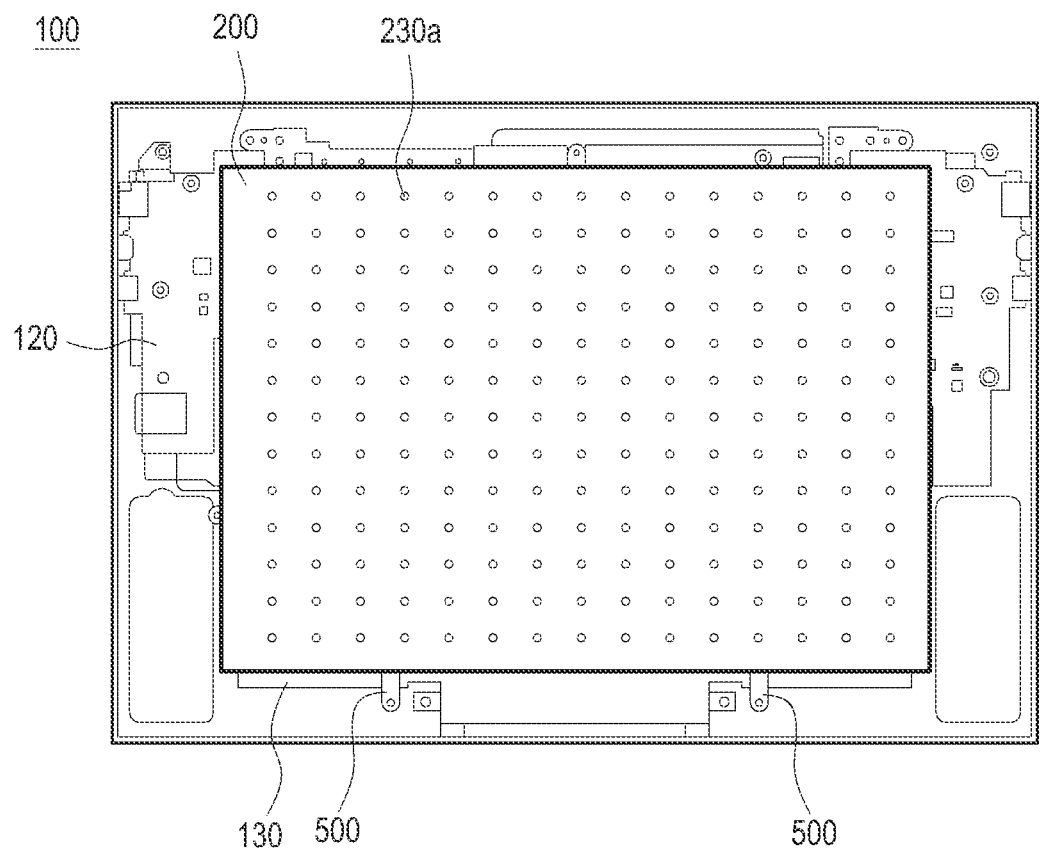
FIG. 8 is a view illustrating an electronic device provided with a heat dissipating apparatus according to an embodiment of the present disclosure, in which a vapor chamber having a prominence and depression member is shown.

FIG. 8 is a view illustrating an electronic device provided with a heat dissipating apparatus according to an embodiment of the present disclosure, in which a vapor chamber having a prominence and depression member is shown.

Referring to FIG. 8, the internal portions 230 and 240 may include the nano-fiber portion 240 and the prominence and depression member 230a. The prominence and depression member 230a are formed instead of the mesh portion 230 as described above. The prominence and depression member 230a may be formed on at least one of the first metal plate 210 and the second metal plate 220 to form the movement path for the refrigerant which is subjected to the phase change. The prominence and depression member 230a may also be formed on a surface of the second metal plate 220 so as to expand a surface area of the vapor chamber 200, thereby increasing a heat dissipating area. Accordingly, the heat transferred through the phase change of the refrigerant can be easily dissipated outside of the vapor chamber 200 through the surface of the vapor chamber 200.

Figure 9A:
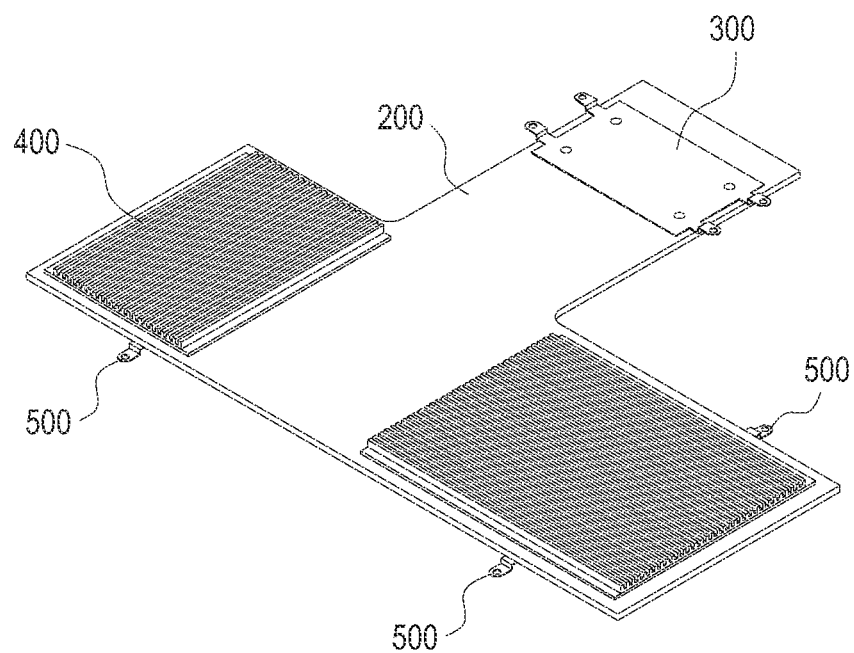
FIGS. 9A and 9B are perspective views illustrating a heat dissipating apparatus provided with a heat sink in electronic device provided with the heat dissipating apparatus according to an embodiment of the present disclosure.
Figure 9B:
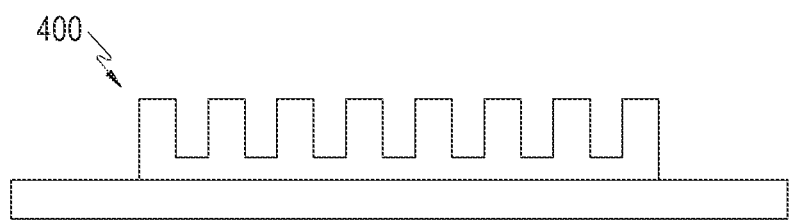

FIGS. 9A and 9B are perspective views illustrating a heat dissipating apparatus provided with a heat sink in electronic device provided with the heat dissipating apparatus according to an embodiment of the present disclosure.

Referring to FIGS. 9A and 9B, one or more heat sinks 400 may be provided on the surface of the vapor chamber 200 of the present disclosure in order to efficiently implement the heat transfer and the heat dissipation when the heat transferred through the phase change of the refrigerant is dissipated through the surface of the vapor chamber 200. Although the heat sink 400 is shown in FIGS. 9A and 9B as disposed around a circumference of the vapor chamber 200, the heat sink 400 may be formed as plural slots. The heat sink 400 may be formed in one-piece on the surface of the first metal plate 210 or the second metal plate 220. Alternatively, the heat sink 400 may be separately formed in such a manner that a plate having slots is attached to the first metal plate 210 or the second metal plate 220.

Figure 10A:
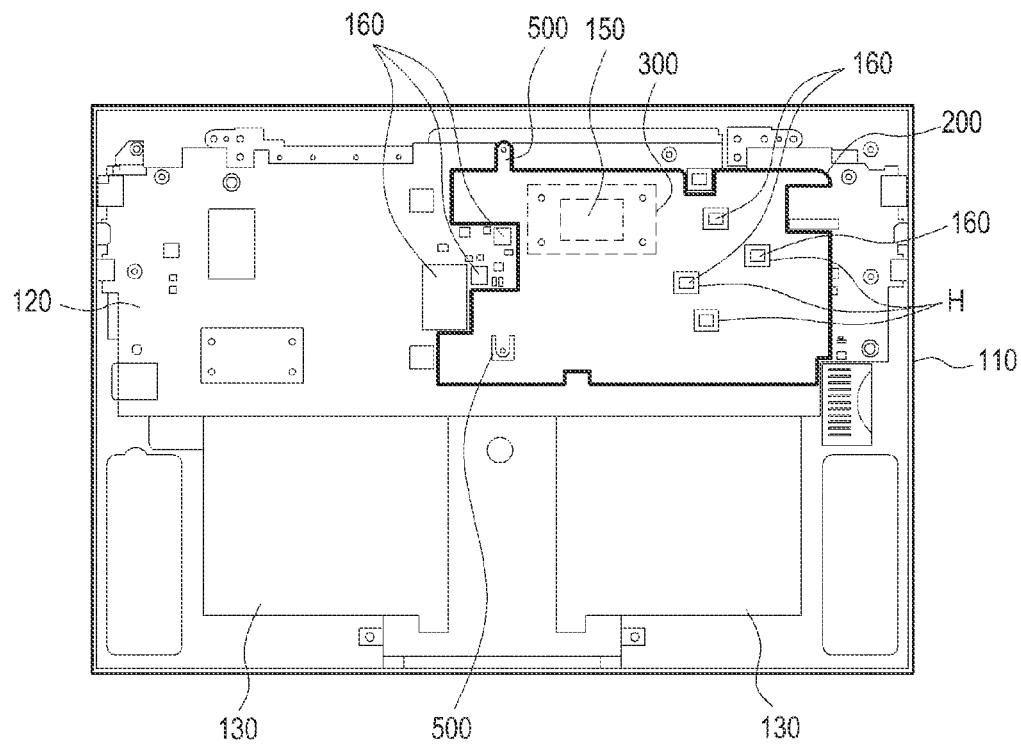
FIGS. 10A and 10B are views illustrating a heat dissipating apparatus provided with a graphite sheet in electronic device provided with the heat dissipating apparatus according to an embodiment of the present disclosure.
Figure 10B:
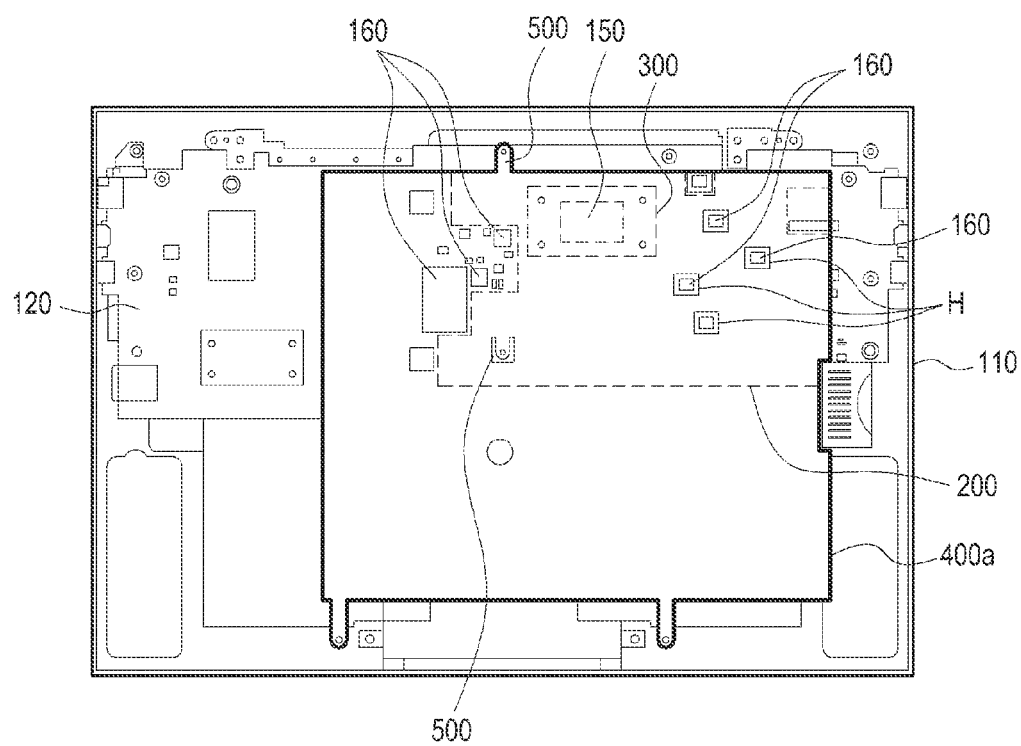

FIGS. 10A and 10B are views illustrating a heat dissipating apparatus provided with a graphite sheet of the electronic device according to an embodiment of the present disclosure.

Referring to FIGS. 10A and 10B, in a case that an expansion of the area of the vapor chamber 200 is restricted, heat dissipation efficiency can be increased by attaching the heat sink 400 to the vapor chamber 200 with a restricted size as shown in FIGS. 9A and 9B. However, in FIGS. 10A and 10B, a graphite sheet 400a made of a carbon material is attached to the vapor chamber 200, so that the heat transferred from the vapor chamber 200 with the restricted area can be dissipated in a manner similar to that of the heat sink. Accordingly, as shown in FIGS. 9A, 9B, 10A and 10B, the heat transferred from the heat generating element 160 to the vapor chamber 200 is transferred to an end of the vapor chamber 200 through the refrigerant and the thermal conductivity. Further, the heat sink 400 or the graphite sheet 400a can rapidly achieve the heat diffusion.

Figure 11A:
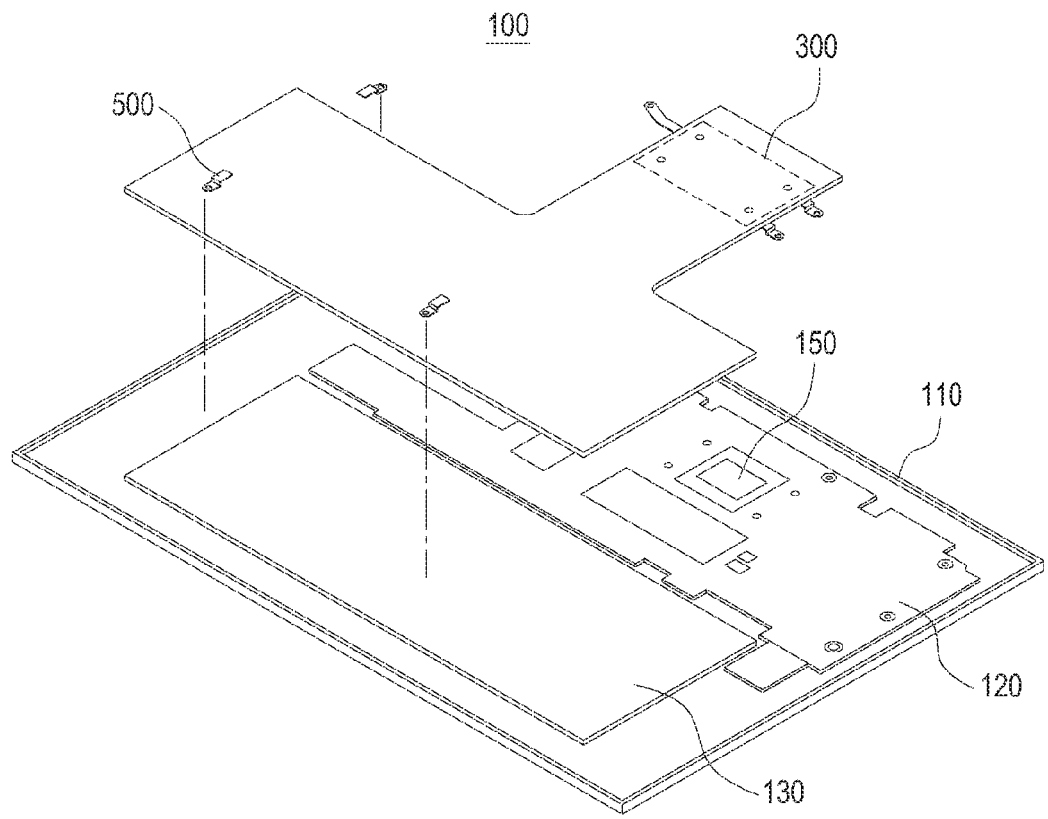
FIGS. 11A and 11B are an exploded perspective views illustrating an electronic device provided with a heat dissipating apparatus according to an embodiment of the present disclosure.
Figure 11B:
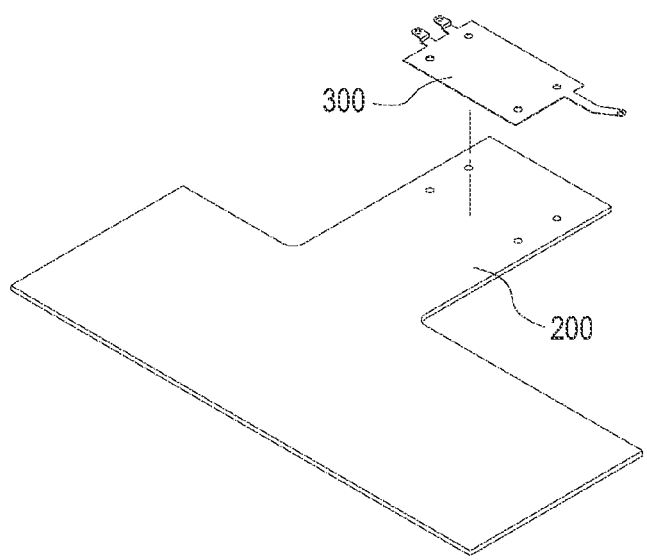
Figure 12:
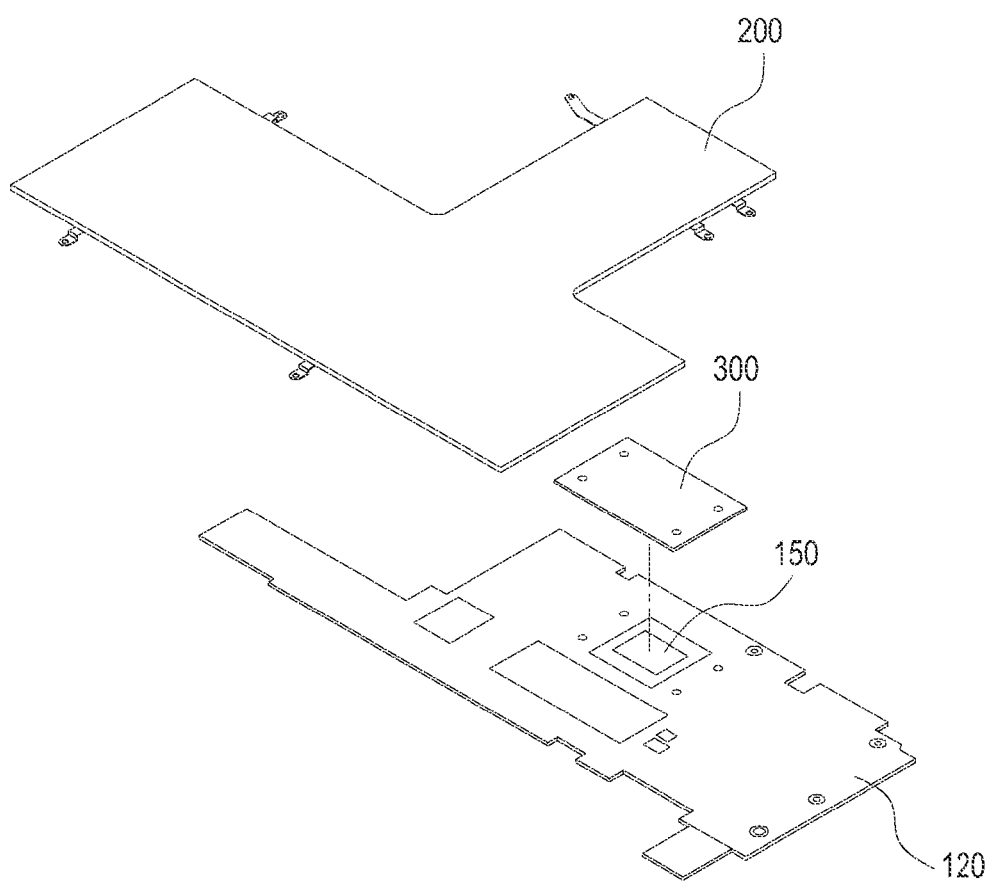
FIG. 12 is a perspective view illustrating a heat dissipating apparatus of the electronic device according to an embodiment of the present disclosure, in which a block module is interposed between an internal circuit board and a vapor chamber.

FIGS. 11A and 11B are exploded perspective views illustrating an electronic device provided with a heat dissipating apparatus according to an embodiment of the present disclosure. FIG. 12 is a perspective view illustrating a heat dissipating apparatus of an electronic device according to an embodiment of the present disclosure, in which a block module is interposed between an internal circuit board and a vapor chamber.

Referring to FIGS. 11A, 11B and 12, the heat dissipating apparatus may further include the block module 300 on an outer surface of the first metal plate 210 or the second metal plate 220 of the heat diffusion type heat dissipating module 200, particularly, the vapor chamber 200, opposite to the heat generating element 150 according to the embodiment of the present disclosure, so as to enable the block module 300 to transfer the heat generated by the heat generating element 150 to the heat diffusion type heat dissipating module 200. The block module 300 may be made of a material having a high heat transfer index, like the copper block, and be in contact with a surface of the heat generating element 150 and a surface of the vapor chamber 200 between the heat generating element 150 and the vapor chamber so as to transfer the heat of the heat generating element 150 to the vapor chamber 200 (see FIGS. 3, 4, 5, 9A and 9B).

As described above, in the stacked structure of the heat diffusion type heat dissipating element provided with the mesh portion 230 according to the embodiment, the first metal plate 210, the mesh portion 230, the nano-fiber portion 240, and the second metal plate 220 can be sequentially stacked, and the block module 300 is mounted on the surface of the second metal plate 220. At least one heat sink 400 may be provided on the surface of the first metal plate 210.

Alternatively, in the stacked structure of the heat diffusion type heat dissipating element which has no mesh portion 230, the first metal plate 210 with the prominence and depression member 230a, the nano-fiber portion 240, and the second metal plate 220 can be sequentially stacked, and the block module 300 may be mounted on the surface of the second metal plate 220. The vapor chamber 200 may have a weight reduced in proportion to the thickness of the mesh portion 230, as compared with the vapor chamber 200 provided with the mesh portion 230.

Figure 13:
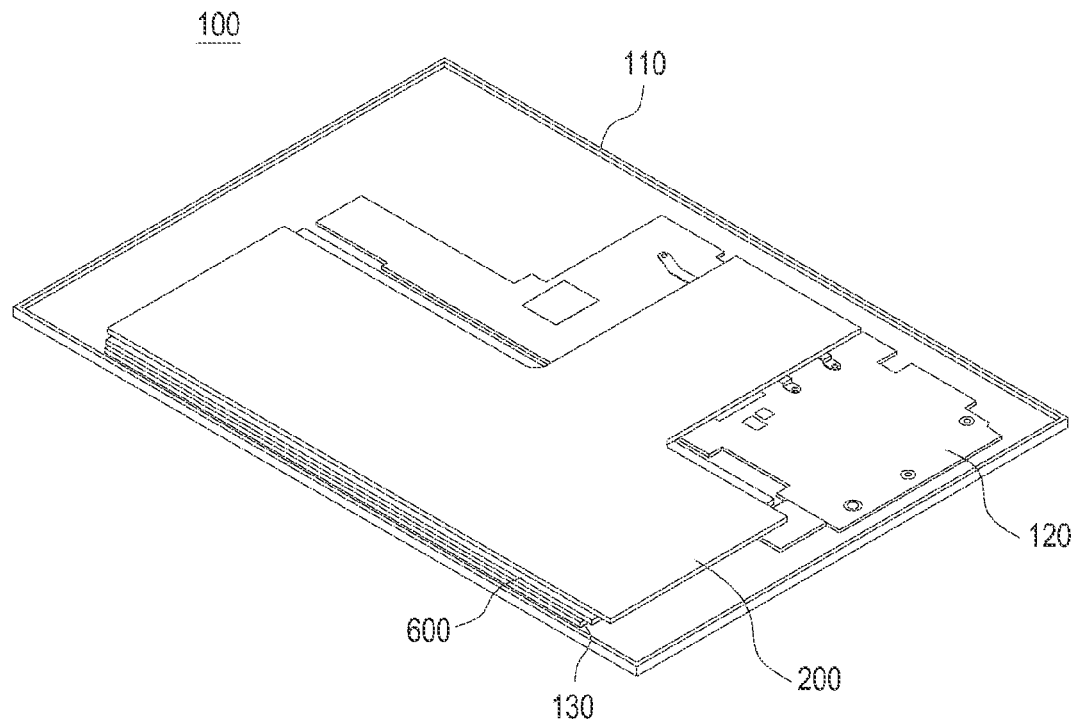
FIG. 13 is a perspective view illustrating an electronic device provided with a heat dissipating apparatus according to an embodiment of the present disclosure, in which a heat transfer member is stacked.
Figure 14:
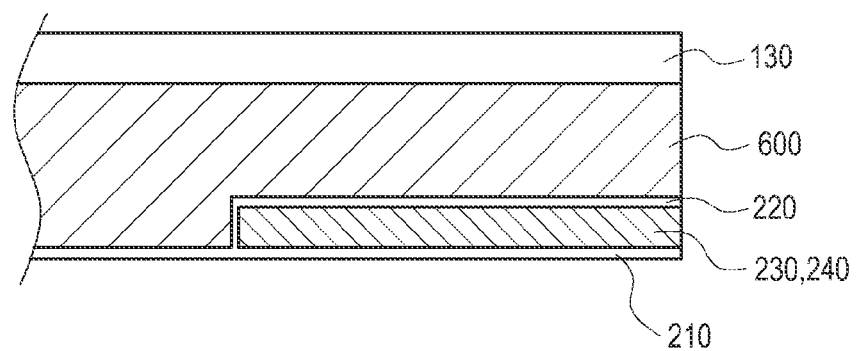
FIG. 14 is a sectional view illustrating an electronic device provided with a heat dissipating apparatus according to an embodiment of the present disclosure, in which a heat transfer member is stacked.

FIG. 13 is a perspective view illustrating an electronic device provided with a heat dissipating apparatus according to an embodiment of the present disclosure, in which a heat transfer member is stacked. FIG. 14 is a sectional view illustrating an electronic device provided with a heat dissipating apparatus according to an embodiment of the present disclosure, in which a heat transfer member is stacked.

Referring to FIGS. 13 and 14, a battery 130 may be mounted on the internal circuit board 120 or inserted in the body 110 so as to supply electric power to the electronic device 100. In this structure, the heat diffusion type heat dissipating element according to an embodiment of the present disclosure may be provided to extend toward the battery 130. When the heat diffusion type heat dissipating element extends toward the battery 130, the heat transferred from the heat generating element 150 to a first portion (of the heat diffusion type heat dissipating element adjacent to the battery 130 affects the battery 130. If the heat transferred to the first portion is transferred from the first portion to the battery 130 again, the heat may cause the temperature of the battery 130 to increase, resulting in the degradation of a charging performance in the battery 130, or the reduction of the life span of the battery 130. Accordingly, in order to prevent the heat transferred to the first portion from being transferred to the battery 130, a heat insulation member 600 may be disposed on the vapor chamber 200 of the first portion, and particularly, may be interposed between the second metal plate 220 and the battery 130 of the first portion. The heat insulation member 600 may be formed of an air gap, or may be made of a plate with low heat conductivity, so as to insulate the second metal plate 220 and the battery 130 of the first portion between the second metal plate 220 and the battery 130.

Figures 15A, 15B:
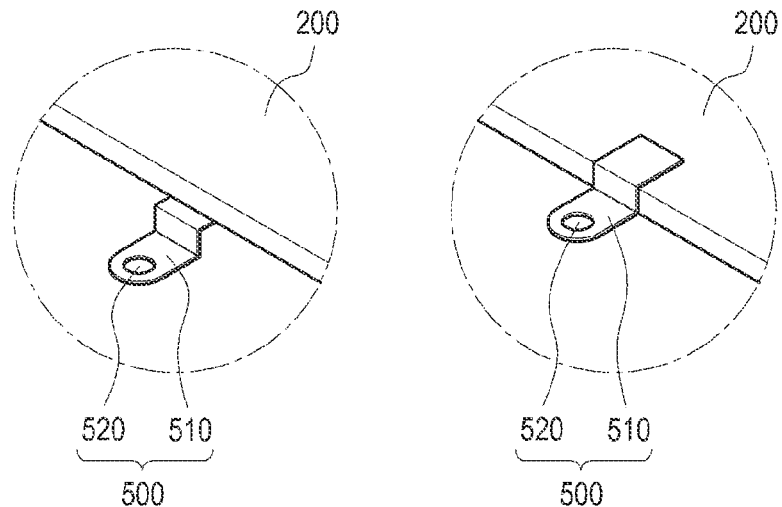
FIGS. 15A and 15B are views illustrating a coupling member in an electronic device provided with a heat dissipating apparatus according to an embodiment of the present disclosure.

FIGS. 15A and 15B are views illustrating a coupling member in the electronic device provided with the heat dissipating apparatus according to an embodiment of the present disclosure.

Referring to FIGS. 15A and 15B, the vapor chamber 200 may further include the coupling member 500 for coupling the vapor chamber 200 to the inside of the body 110. Two structures of the coupling member 500 according to various embodiments of the present disclosure are described below; however, these are to be understood merely as an example.

The coupling member 500, which couples the vapor chamber 200, may include a coupling protrusion 510 or a fixing member (not shown) (see FIGS. 3, 4, 5 and 7). The coupling protrusion 510 may be provided in one-piece along the periphery of the vapor chamber 200 (or an intermediate portion of the vapor chamber 200). The coupling protrusion may be bent according to the stacked state of the vapor chamber 200 and the body 110, thereby preventing the increase of the thickness due to the coupling member 500. The coupling protrusion may have a coupling hole 520 to which a fixing member is coupled. The vapor chamber 200 of the present disclosure may have an area similar to that of the inner surface of the body 110, or an area equal to or larger than half an area of the inner surface of the body 110. Therefore, the coupling hole 520 may be formed at predetermined portions as well as around the periphery of the vapor chamber 200 so as to couple the vapor chamber 200 to the body 110. The fixing member may extend through the coupling protrusion 510, particularly, the coupling hole 520 and be coupled to a fixing portion, such as a boss, formed on the body 110 or the internal circuit board 120.

The coupling member 500, which couples the vapor chamber 200 to the body 110 according to the embodiment of the present disclosure, may include a coupling plate 510 or a fixing member (not shown) (see FIGS. 9A and 9B). The coupling plate 510 may be bent according to the stacked state of an end of the vapor chamber 200 and the body 110. A coupling hole may be formed in the coupling plate disposed on the body 110 to be coupled with the fixing portion, such as a boss, formed on the body 110 or the internal circuit board 120. The coupling member is coupled with the boss and the like through the coupling hole of the coupling plate, so that the vapor chamber 200 is fixed to the body 110.

Figure 16:
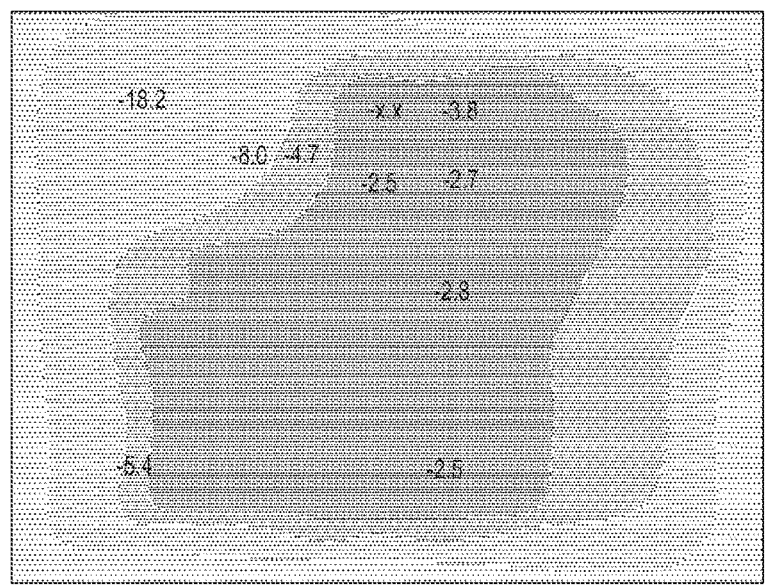
FIG. 16 is a view illustrating a heat diffusion distribution in an electronic device provided with a heat dissipating apparatus according to an embodiment of the present disclosure.

FIG. 16 is a view illustrating a heat diffusion distribution in an electronic device provided with a heat dissipating apparatus according to various embodiments of the present disclosure.

Referring to FIG. 16, when the electronic device 100 provided with the heat dissipating apparatus according to various embodiments of the present disclosure operates, the heat generating element 150 discharges high temperature heat. The heat discharged from the heat generating element 150 is transferred to the vapor chamber 200 through the block module 300. The heat transferred to the vapor chamber 200 is transferred to an end of the vapor chamber 200 by the refrigerant of the vapor chamber 200, so as to make the heat diffusion. The heat diffused toward the surface or the end of the vapor chamber 200 may be efficiently dissipated in the wider area through the heat sink or the graphite on the vapor chamber 200. Accordingly, as the high heat of the heat generating element 150 is transferred to the end of the vapor chamber 200, the heat may be diffused and discharged from a whole region of the electronic device. If the heat diffusion distribution of the heat dissipating apparatus according to various embodiments of the present disclosure is compared with that of the heat dissipating apparatus according to the related art, the hot-spot region is no longer present, as shown in FIG. 16.

As described above, the coupling member 500 according to various embodiments of the present disclosure, which includes the coupling protrusion and the fixing member, or the coupling plate and the coupling member, has been described as an example, but the coupling member is not limited thereto. For example, the coupling member may be varied and modified in such a manner that the vapor chamber 200 may be coupled with the body 110 by using a bonding member such as a double-sided adhesive tape.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A heat dissipating apparatus comprising:
    a vapor chamber comprising:
        a first portion disposed at a heat generating element mounted on an internal circuit board of a body of an electronic device, the first portion being configured to diffuse heat from the heat generating element to a second portion of the vapor chamber;
        the second portion disposed at a circumference surface of an inside portion of the body, the circumference surface of the inside portion of the body having a low temperature portion with a temperature lower than a temperature of the heat generating element; and
        an interference prevention portion, if an interference element is present, the interference prevention portion being configured to prevent transfer of the heat from the vapor chamber to the interference element,
    wherein the vapor chamber has a sheet shape and is greater than or equal to half a size of the body of the electronic device.

2. The heat dissipating apparatus as claimed in claim 1, wherein the vapor chamber further comprises:
    a first metal plate having a sheet shape and extending from the heat dissipating element to a peripheral surface of the inside of the body;
    a second metal plate stacked on the first metal plate and extending from the heat dissipating element to the peripheral surface of the inside of the body;
    a refrigerant member interposed between the first metal plate and the second metal plate; and
    a sealing portion sealing a space between the first metal plate and the second metal plate.

3. The heat dissipating apparatus as claimed in claim 2, further comprising:
    an internal member interposed between the first metal plate and the second metal plate, the internal member being configured to facilitate movement of the refrigerant member filled therein.

4. The heat dissipating apparatus as claimed in claim 3, wherein the internal member comprises:
    a mesh portion stacked between the first metal plate and the second metal plate and functioning as an air retainer for allowing the movement of the refrigerant member while the refrigerant member is gasified; and
    a nano-fiber portion stacked between the first metal plate and the mesh portion.

5. The heat dissipating apparatus as claimed in claim 4, wherein the mesh portion comprises a woven structure of metal wire.

6. The heat dissipating apparatus as claimed in claim 2, wherein the second metal plate is provided with a prominence and depression member forming an air retainer of the refrigerant member.

7. The heat dissipating apparatus as claimed in claim 2, further comprising:
    one or more heat sinks arranged on at least one of the first metal plate and the second metal plate.

8. The heat dissipating apparatus as claimed in claim 2, further comprising:
a coupling member coupling the vapor chamber to the inside of the body,
wherein the coupling member is disposed on a periphery of at least one of the first metal plate and the second metal plate.

9. The heat dissipating apparatus as claimed in claim 2, wherein the sealing portion seals a mounting space of the refrigerant member along circumferences of the first metal plate and the second metal plate and a circumference of the interference prevention portion.

10. The heat dissipating apparatus as claimed in claim 9, wherein the sealing portion is sealed by at least one of seam welding, laser welding, soldering, brazing, and bonding.

11. The heat dissipating apparatus as claimed in claim 2, further comprising:
a block module configured to transfer heat generated by the heat generating element to the first portion of the vapor chamber and arranged on a surface of the vapor chamber.

12. The heat dissipating apparatus as claimed in claim 11, wherein the block module includes a copper block.

13. The heat dissipating apparatus as claimed in claim 2, wherein the first metal plate and the second metal plate are made of at least one of a copper sheet, an aluminum sheet, and a stainless steel sheet.

14. An electronic device including a heat dissipating apparatus, the electronic device comprising:
a body;
an internal circuit board provided in the body and including at least one heat generating element;
a vapor chamber provided in the body and stacked on a surface of the internal circuit board, the vapor chamber comprising:
a first portion disposed at the heat generating element, the first portion being configured to diffuse heat generated by the heat generating element to a second portion of the vapor chamber;
the second portion disposed at a circumference surface of a peripheral portion of the body being a low temperature region having a temperature lower than a temperature of the at least one heat generating element; and
an interference prevention portion formed in the vapor chamber if an interference element is present on the internal circuit board, the interference prevention portion being configured to prevent transfer of the heat from the vapor chamber to the interference element; and
a block module configured to transfer the heat of the heat generating element to the vapor chamber,
wherein the vapor chamber further comprises:
a first metal plate having a sheet shape and extending from the heat generating element to the low temperature portion;
a second metal plate stacked on the first metal plate and extending from the heat generating element to the low temperature portion;
a refrigerant member interposed between the first metal plate and the second metal plate; and
a sealing portion sealing a mounting space of the refrigerant member along circumferences of the first metal plate and the second metal plate and a circumference of the interference prevention hole,
wherein the vapor chamber has a sheet shape and is greater than or equal to half a size of the body of the electronic device.

15. The electronic device as claimed in claim 14, further comprising an internal member interposed between the first metal plate and the second metal plate, the internal member being configured to facilitate movement of the refrigerant member filled therein.

16. The electronic device as claimed in claim 15, wherein the internal member comprises:
a mesh portion stacked between the first metal plate and the second metal plate and configured to allow the movement of the refrigerant member while the refrigerant member is gasified, the mesh portion comprising a woven structure of metal wire; and
a nano-fiber portion stacked between the first metal plate and the mesh portion.

17. The electronic device as claimed in claim 15, wherein the second metal plate is provided with a prominence and depression member forming an air retainer of the refrigerant member.

18. The electronic device as claimed in claim 14, further comprising:
one or more heat sinks on at least one surface of the vapor chamber.

19. The electronic device as claimed in claim 14, wherein a coupling member is disposed at a periphery of the vapor chamber, the coupling member being configured to fix the vapor chamber to the inside of the body.

20. The electronic device as claimed in claim 14, further comprising:
a heat insulation member between the vapor chamber and a battery,
wherein the vapor chamber overlaps at least a portion of the battery mounted on the body.

21. The electronic device as claimed in claim 14, wherein the first metal plate and the second metal plate are made of at least one of a copper sheet, an aluminum sheet, and a stainless steel sheet.

22. An electronic device comprising:
a body;
an internal circuit board provided in the body and including at least one heat generating element; and
a heat diffusion type heat dissipating module provided in the body and stacked on a surface of the internal circuit board, the heat dissipating module being configured to diffuse heat generated by the heat generating element toward a low temperature region of the body having a lower temperature than a temperature of the at least one heat generating element,
wherein the heat diffusion type heat dissipating module has a sheet shape and extends from a first portion at the heat generating element to a second portion disposed at a circumference surface of an inside of the body and further configured so that the heat is transferred from the heat generating element to the low temperature region, and
wherein the heat diffusion type heat dissipating module is greater than or equal to half a size of the body of the electronic device.

23. The electronic device as claimed in claim 22, wherein the heat diffusion type heat dissipating module further comprises a block module arranged opposed to the heat generating element and configured to transfer the heat generated by the heat generating element to the first portion at the heat diffusion type heat generating module.

24. The electronic device as claimed in claim 23, wherein the block module includes a copper block, and
wherein heat grease or a heat pad is applied between a contact surface of the copper block and the heat generating element.

25. The electronic device as claimed in claim 22, wherein the heat diffusion type heat dissipating module comprises a vapor chamber.

26. The electronic device as claimed in claim 25, wherein the vapor chamber comprises:
a first metal plate;
a second metal plate stacked on the first metal plate; and
a refrigerant member interposed between the first metal plate and the second metal plate.

27. The electronic device as claimed in claim 26, wherein the refrigerant member includes at least one of water, acetone, and ammonium.

28. The electronic device as claimed in claim 26, further comprising:
an internal member interposed between the first metal plate and the second metal plate,
wherein the internal member is configured to facilitate a movement of the refrigerant member filled therein.

29. The electronic device as claimed in claim 28, wherein the internal member comprises:
a nano-fiber portion stacked between the first metal plate and the second metal plate; and
a mesh portion stacked between the nano-fiber portion and the second metal plate and between the first metal plate and the second metal plate, and configured to facilitate a movement of the refrigerant member which is gasified.

30. The electronic device as claimed in claim 29, wherein the mesh portion comprises a woven structure of metal wire.

31. The electronic device as claimed in claim 26, further comprising:
a sealing portion sealing a mounting space for the refrigerant member along circumferences of the first and second metal plates.

32. The electronic device as claimed in claim 31, wherein the sealing portion is sealed by at least one of seam welding, laser welding, soldering, brazing, and bonding.

33. The electronic device as claimed in claim 26, wherein the first metal plate and the second metal plate are made of at least one of a copper sheet, an aluminum sheet, and a stainless steel sheet.

34. The electronic device as claimed in claim 26, wherein the second metal plate is provided with a prominence and depression member forming an air retainer of the refrigerant member.

35. The electronic device as claimed in claim 25, wherein one or more heat sinks are disposed on at least one surface of the vapor chamber.

36. The electronic device as claimed in claim 25, wherein a coupling member is formed at a periphery of the vapor chamber, the coupling member being configured to fix the vapor chamber to the inside of the body.

37. The electronic device as claimed in claim 36, wherein the coupling member comprises:
a coupling protrusion formed in one piece at the periphery of the vapor chamber or an intermediate portion; and
a fixing member provided to the coupling protrusion, and fixed to the inside of the body through the coupling protrusion.

38. The electronic device as claimed in claim 36, wherein the coupling member comprises:
a coupling plate seated along the periphery of the vapor chamber; and
a fixing member provided to the coupling plate, and fixed to the inside of the body through the coupling plate.

39. The electronic device as claimed in claim 25, wherein an interference prevention hole is formed in the vapor chamber at a location of an interference element, the interference prevention hole being configured to prevent transfer of the heat from the vapor chamber to the interference element.

40. The electronic device as claimed in claim 39, further comprising:
a prevention-hole sealing portion sealing a mounting space of the refrigerant member arranged at a circumference of the interference prevention hole.

41. The electronic device as claimed in claim 25, further comprising:
a heat insulation member disposed between the vapor chamber and a battery,
wherein the vapor chamber overlaps at least a portion of the battery mounted on the body.

\* \* \* \* \*